United States Patent
Grehant

(10) Patent No.: US 6,417,598 B2
(45) Date of Patent: Jul. 9, 2002

(54) POWER CIRCUIT FOR PIEZO-ELECTRIC MOTOR

(75) Inventor: Bernard Grehant, Nancy-sur-Cluses (FR)

(73) Assignee: Metabole Development et Conseil, Cluses (FR)

(*) Notice: Subject to any disclaimer, the term of this patent is extended or adjusted under 35 U.S.C. 154(b) by 0 days.

(21) Appl. No.: 09/730,905

(22) Filed: Dec. 6, 2000

(30) Foreign Application Priority Data

Dec. 9, 1999 (FR) .............................. 99 15550

(51) Int. Cl.[7] .............................................. H01L 41/08
(52) U.S. Cl. ......................... 310/316.01; 310/316.02; 310/317
(58) Field of Search ..................... 310/317, 316.01, 310/316.02, 316.03

(56) References Cited

U.S. PATENT DOCUMENTS

| | | |
|---|---|---|
| 4,339,682 A | 7/1982 | Toda et al. |
| 4,562,374 A | 5/1984 | Sashida |
| 4,510,411 A | 4/1985 | Hakamata et al. |
| 4,588,917 A * | 5/1986 | Ratcliff ................. 310/316.01 |
| 5,021,700 A | 6/1991 | Takahashi et al. |
| 5,130,619 A | 7/1992 | Izuno |
| 5,140,231 A | 8/1992 | Kashiyama |
| 5,179,311 A | 1/1993 | Suganuma |
| 5,210,454 A * | 5/1993 | Naito ...................... 310/316.02 |
| 5,625,246 A | 4/1997 | Suganuma |
| 5,886,483 A | 3/1999 | Nogarede et al. |

FOREIGN PATENT DOCUMENTS

| | | |
|---|---|---|
| JP | 01107681 A | 4/1989 |
| WO | WO 95/34097 | 12/1995 |

* cited by examiner

*Primary Examiner*—Mark O. Budd
(74) *Attorney, Agent, or Firm*—Bugnion S.A.; John Moetteli

(57) ABSTRACT

Power circuit for traveling or standing wave piezo-electric motors comprising a series resonant circuit, a switching element (T1) in parallel with the capacitor C of the resonant circuit and a switching element control (O) ensuring the cyclic closure thereof at a frequency close to the resonant frequency of the resonant circuit. The power circuit includes a transformer (Tr) whose primary constitutes the inductance of the resonant circuit and whose secondary is linked to the piezo-electric exciter, this transformer exhibiting a small magnetic inductance at the primary. An advantage of this power supply is in particular the almost-zero heating of the switching element and low current consumption.

6 Claims, 3 Drawing Sheets

POWER CIRCUIT FOR PIEZO-ELECTRIC MOTOR

BACKGROUND OF THE INVENTION

The subject of the invention is a power circuit for traveling or standing wave piezo-electric motors comprising a voltage source powering a circuit consisting of an inductance in series with, on the one hand, a capacitor and, on the other hand, a single switching element in parallel with the capacitor, and a means of control of the switching element ensuring the cyclic closure thereof at a frequency close to the resonant frequency of the piezo-electric element.

A great many assemblies have been proposed for the powering and control of the piezo-electric exciters intended to power traveling wave or standing wave motors.

PRIOR ART

Patents U.S. Pat. No. 4,339,682, the content of which is incorporated by reference, and U.S. Pat. No. 4,562,374, the content of which is incorporated by reference thus propose the use of two AC current sources 90° out of phase.

In patent U.S. Pat. No. 4,510,411, the content of which is incorporated by reference, the supply voltages powering the two channels of a traveling wave piezo-electric motor are obtained at the output of amplifier assemblies comprising a large number of controlled breakers required for powering the two channels. Power circuits of the same type are used in the control circuits according to patents U.S. Pat. No. 5,021,700, the content of which is incorporated by reference, and U.S. Pat. No. 5,130,619, the content of which is incorporated by reference. The large number of controlled breakers will also be noted in both these documents. Such is the case likewise for the control device according to patent U.S. Pat. No. 5,625,246, the content of which is incorporated by reference, which additionally uses two transformers. The power supplies sold under the trademark SHINSEI for powering USR30, USR45 and USR60 type motors thus comprise one transformer and two MOS transistors per channel. The transistors must switch the current under a relatively large voltage and they are consequently mounted on a heat sink so as to limit their heatup.

In a very simplified power supply with transformer, described in patent application U.S. Pat. No. 5,886,483, the content of which is incorporated by reference, use is made of a single switching element for the two supply channels of the motor, but this arrangement requires the use of an additional primary winding, with diode, for demagnetizing the magnetic circuit, according to the so-called "forward" assembly. These circuits also include the particular feature of grouping the two channels onto the same transformer with two secondaries, while using a quadripole on one of the secondary circuits to bring about the sought-after 90° phase shift. As in the circuits cited above, the transistor constituting the breaker does not switch either at zero current, or at zero voltage, thus causing it to heat up, this heating up making it necessary to remove the heat produced. If one wishes to use this "forward" assembly while imposing, as is generally the case, a 90° phase shift on the basis of the control signals, two separate supply channels are necessary, with two separate transformers, each comprising at the primary a main coil linked to each switching element and a demagnetization coil intended to prevent the appearance of a DC component of high value, which would cause a degradation in the operation of the power supply circuit. In all cases, the demagnetization coil comprises as many turns as the main coil, this representing a bulk and an expense which one would prefer to avoid.

In patent U.S. Pat. No. 5,179,311, the content of which is incorporated by reference, there is described a power supply circuit in which a high cyclic voltage is generated by means of a resonance-type converter. The general principle of the resonance-type power supply is described, for example, in the work "POWER-ELECTRONICS" Converters, Applications and Design published by John Wiley & Sons, Inc, second edition, by Mohan, Undeland and Robbins, page 271 to 273. On looking at FIG. 2 of patent U.S. Pat. No. 5,179,311, it is observed, in a simplified manner, by considering the frequency of the piezo-electric exciter, that this involves the powering, across a coil of inductance LO, of a load R mounted in parallel with a capacitor of capacitance CO and a switching element driven at a frequency close to the resonant frequency of the LO/CO circuit. In order to obtain a near-sinusoidal voltage of sufficient amplitude (FIG. 4), a second inductance is added in series with the load and the resonant nature of the power supply is maintained by a capacitor in parallel with the switching transistor. The high value of the voltages to be applied to each channel and the desire to approximate to a sinusoidal voltage at output, in practice certainly necessitate high inductances and hence the use of ferrite-core coils. Under these conditions, two coils turn out to be at least as bulky and expensive as a two-winding transformer which, as is known, has the advantage of (often very useful) galvanic isolation between primary and secondary.

One might ask oneself why use has not been made of a transformer in such a resonance-type power supply, either by Suganuma (U.S. Pat. No. 5,179,311), or by other inventors. On the contrary, it is observed that Suganuma, who in spite of everything reverts to the use of a transformer in the later patent U.S. Pat. No. 5,625,246, seems to have abandoned the inserting of this transformer into a resonance-type structure and returns to the conventional assemblies of the prior art.

The reasons appear to be the following:

If the primary of a transformer is wired in parallel with the breaker (transistor), the sought-after galvanic isolation is indeed obtained but once again with the need for an additional demagnetization coil since the primary of the transformer is subjected to a large DC component. This solution therefore exhibits no economic advantage.

Using the primary of a transformer as inductance of the resonant circuit also came to mind. Such a solution is represented diagrammatically in FIG. 1 of the appended drawing where L denotes the primary of the transformer, Tr the breaker. What happens is such a circuit? It is known that at the primary a normally sized transformer absorbs a small, or even negligible no-load current relative to the current absorbed at the primary when the secondary is powering a load. As a first approximation, the primary current is proportional to the secondary current, with a factor equal to the ratio of the number of turns (N1.I1=N2.I2). By virtue of a known property of impedance matching, the impedance seen from the primary is that of the load divided by the square of the transformation ratio N2/N1. The ohmmic load R of the transformer is thus referred to the primary. This load represents an equivalent resistance of smaller value if the transformer is voltage boosting. This equivalent resistance will short-circuit the primary inductance of the transformer, so that the manner of operation of the circuit is no longer at all that of a resonance-type power supply, as is represented in FIG. 2 of the appended drawing. It would therefore seem not to be possible to adopt such a structure.

SUMMARY OF THE INVENTION

In spite of contrary teachings, the purpose of the invention is to produce a resonance-type power supply using a simple transformer in such a way as to ensure galvanic isolation of the motor with respect to the remainder of the power supply circuit, but retaining its resonant nature.

The power supply circuit according to the invention is one which comprises a transformer whose primary constitutes the inductance and whose secondary is linked to the piezo-electric exciter, this transformer exhibiting a small magnetic inductance at the primary, wherein the extra current absorbed at full load is always less than the total current absorbed off load, and wherein the sizing of this inductance and the choice of the capacitor are determined in such a way as to obtain switching in the vicinity of the voltage zero for the working frequency of the circuit.

Certainly, patent U.S. Pat. No. 5,140,231, the content of which is incorporated by reference, discloses the powering of a piezo-electric motor by means of two transformer and eight switching transistors, that is to say four transistors per channel, according to a conventional configuration.

However, the purpose of this power supply is very different: it involves being able to power, under the best efficiency conditions, a motor connected to a low-voltage source such as an electric battery, while allowing control of speed over a broad range, whereas the circuit according to the invention uses just a single active component per channel and provides for just a single operating point of the motor. The inventor of the power supply according to the document U.S. Pat. No. 5,140,231 is not concerned with the number of switching components.

Unlike in the case of standard transformers, the magnetizing current, in the circuit according to the invention, is greater than the transformation current imposed by the load referred to the primary.

A free wheel or antiparallel diode, that is to say one which is reverse-mounted, will generally be mounted in parallel with the switching element, but as will be seen hereinbelow, it is possible to dispense with such a diode. Furthermore, if the switching element is a MOS transistor, the intrinsic PN junction seen between source and drain may suffice to replace the antiparallel diode. Likewise, the intrinsic CDS capacitance of the transistor, as seen between source and drain, may suffice to replace the capacitor.

Since the switching of the transistor takes place at zero or almost-zero voltage, the transistor hardly heats up at all. Advantageously, a large gap is made in the magnetic circuit of the transformer. This gap is here intended to very substantially decrease the magnetizing inductance Lm of the transformer, this having the effect of increasing its magnetizing current Io. It follows that, unlike in the case of the normal sizing of transformers, the magnetizing current is here of the order, or even much greater, than the transformation current imposed by the load referred to the primary.

BRIEF DESCRIPTION OF THE DRAWINGS

The appended drawing represents, by way of example, one embodiment of the invention.

DETAILED DESCRIPTION OF THE PREFERRED EMBODIMENT(S)

The circuit is powered by a DC voltage source U. The resonant circuit consists of the primary of a transformer Tr and of a capacitor C. The switching element consists of a transistor T1 of MOS type whose drain is linked to the common point of the capacitor and of the primary of the transformer and whose source is linked to the negative point of the DC current source U. The gate of T1 is linked to an oscillator O applying a cyclic control voltage of frequency f to the transistor T1. The secondary of the transformer Tr is linked to the terminals of a piezo-electric exciter P of the motor. A so-called free wheel or antiparallel diode D is reverse-mounted in parallel with the transistor T1 and with the capacitor C.

The transformer Tr exhibits a structure with a ferrite half-core. An accurate gap is obtained by placing a sheet of a nonmagnetic material such as paper or Mylar (registered trademark) between the cores when assembling the transformer.

Figure 1:
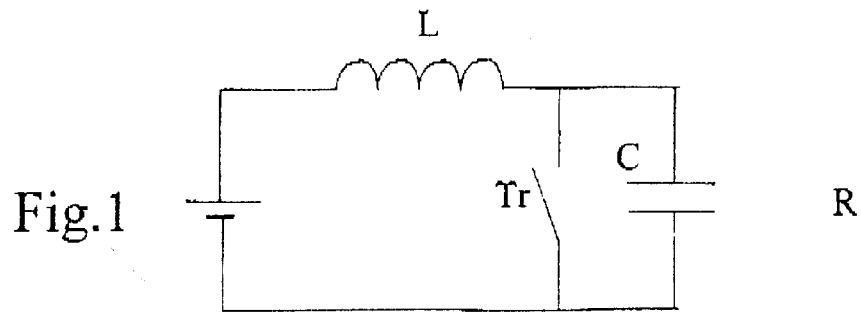
Figure 2:
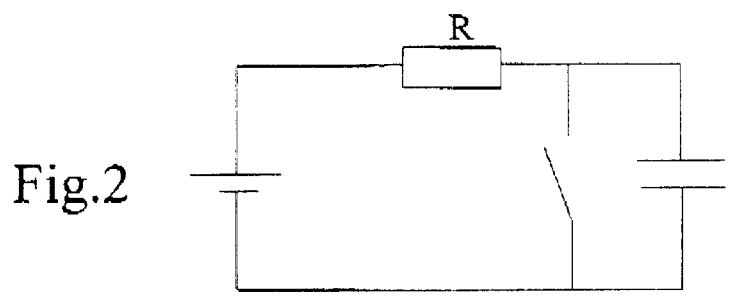
Figure 3:
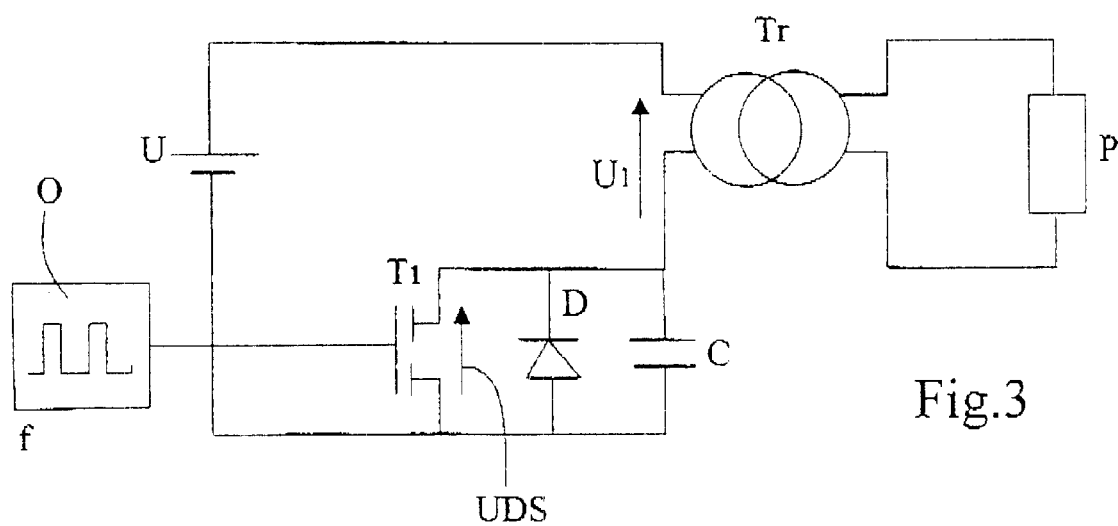
FIG. 3 represents the general diagram of a power supply circuit for one of the channels of a piezo-electric motor.

When the load P is not wired to the terminals of the secondary of the transformer, the resonant nature of the assembly is completely determined by the value C of the capacitor and the magnetizing inductance Lm of the transformer. By reason of the low magnetizing inductance of the transformer, the resonant nature remains largely dominated by these values when the secondary powers the load P. Thus, even under load, the diagram equivalent to the diagram of FIG. 3 remains, as a first approximation, that of FIG. 1.

Parameters are set, in particular through the choice of the gap and/or that of C, such that the frequency of the series circuit Lm/C is slightly below the driving frequency of the piezo-electric element. For stability reasons, explained in the cited prior art, the driving frequency is itself slightly greater than the frequency of electromechanical resonance of the motor.

The power supply to the second channel of the motor is produced in the same way.

Figure 4:
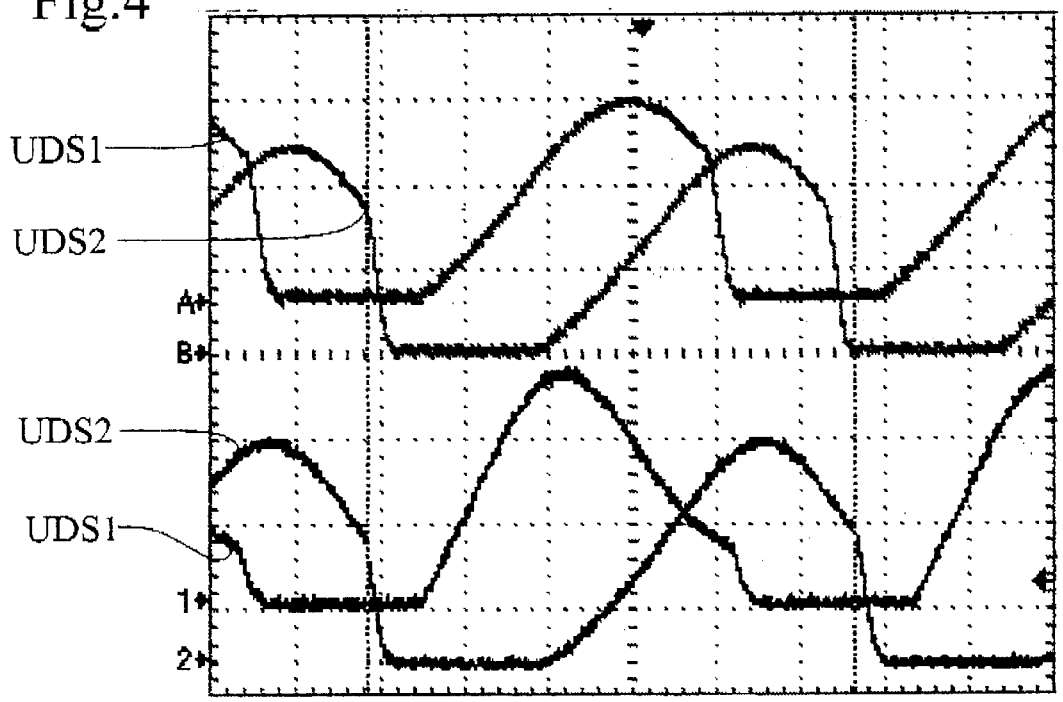
FIG. 4 is the recording of the voltages across the terminals of the transistors of a two-channel power supply of an exemplary embodiment for a supply frequency above the resonant frequency.

For a better understanding of how it is possible, by calculation, simulation or trials, to optimize the waveform, reference is made to FIG. 4 which represents the readouts of the voltages UDS across the terminals of a two-channel power supply. The control voltages for the switching element are here 90° out of phase. Channel 1, A powers an exciter P, while the other channel 2, B is off-load.

A first recording A, B is made at a supply frequency above the resonant frequency of the exciter P. The latter therefore absorbs only very little current and the two channels are identical. The horizontal plateaux correspond to the conduction times of the transistors. As is known from the literature, at the moment when a transistor ceases to conduct, the current crossing it now passes through the capacitor which experiences a rise in its voltage, the slope of which is all the larger the larger was this current.

For the second reading 1, 2, the supply frequency has been brought close to the resonant frequency of the exciter P. It is very clearly apparent that this has no consequence for the voltage UDS2, that is to say the voltage of the channel whose secondary is off-load, while the voltage UDS1 of the channel for which the secondary is under load, increases more rapidly due to the impact of the transformation current which, although small, is added to the current of the inductance Lm. It is also apparent that the switching of T1 to open is more favorable than that of T2: hence, smaller voltage is accompanied by smaller losses.

Figure 5:
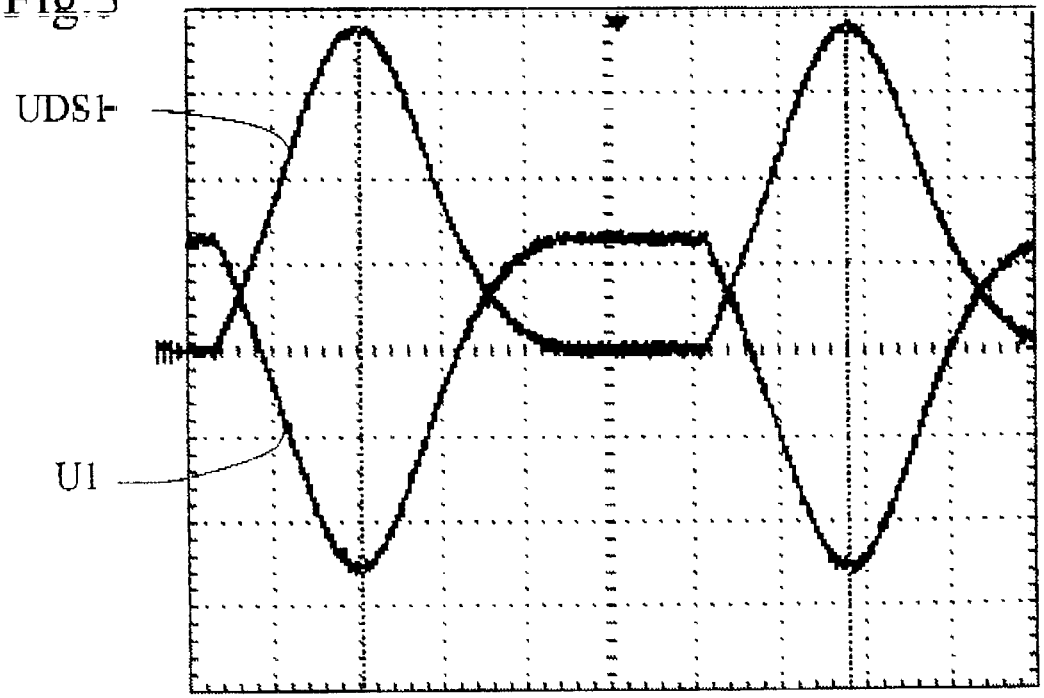
FIG. 5 is the recording of the same voltages for a frequency close to the resonant frequency.

The best efficiency is obtained when the switching of the transistor occurs at the voltage zero. This optimized manner of operation is represented in FIG. 5. The recorded voltages are the voltage UDS1 and the voltage U1 across the terminals of the primary of the transformer for the nominal supply frequency. It is apparent that U1 does not actually exhibit any DC component.

Figure 6:
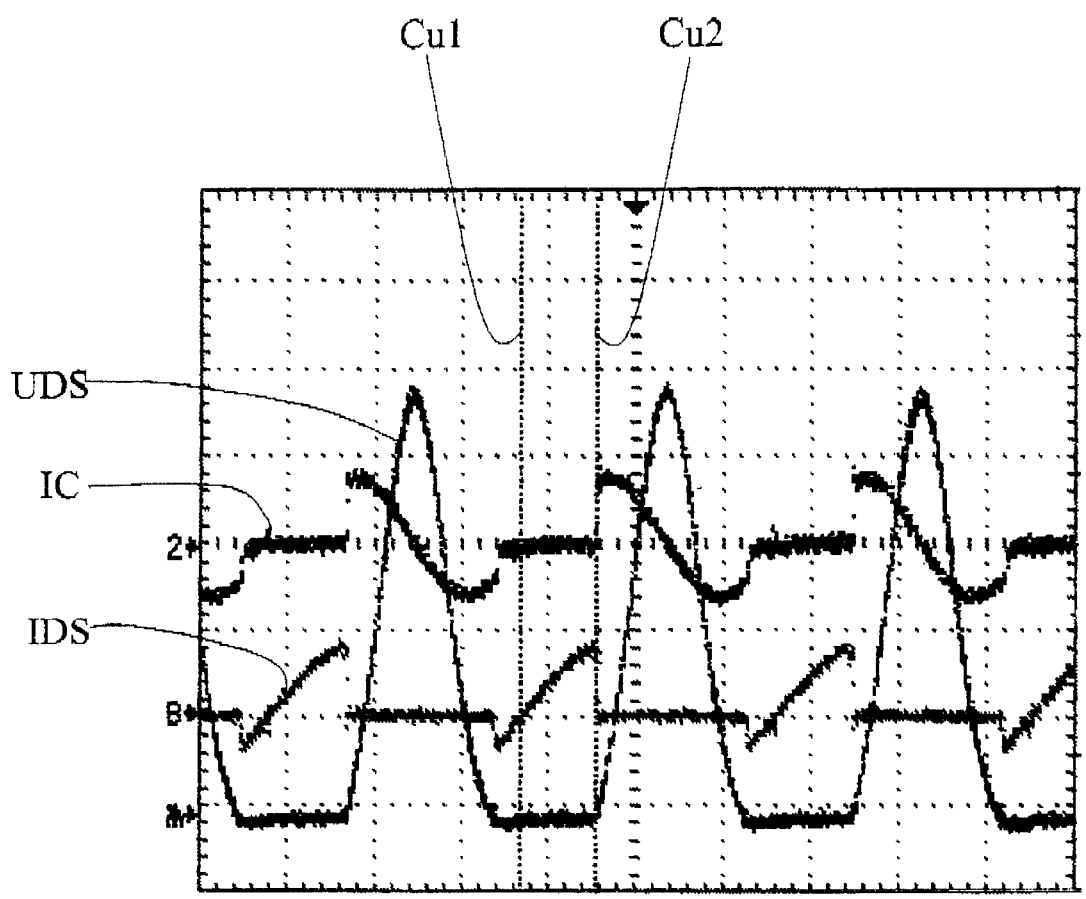
FIG. 6 is the recording of the currents in a channel.

The recording represented in FIG. 6 shows the voltage UDS across the terminals of the power supply, the current IDS in the power supply, that is to say the current crossing the transistor, and the current in the capacitor C. This recording shows that here it would be judicious to decrease the slope at the origin of the voltage UDS and hence the horizontal plateau, so as to approximate a sinusoid even more closely. It is possible to act as one pleases on C, by increasing it, or on Lm, by altering the number of turns of the transformer or altering the gap.

The horizontal plateau of UDS is longer than the simple controlled conduction time of the transistor, demarcated by the two vertical cursors Cu1 and Cu2. There is a phase during which UDS is in fact equal to −0.6 V: it is the diode D which then ensures conduction. If the temporal sizing has been done properly, this phase does not occur and D is unnecessary. If T1 is a MOS transistor, its intrinsic diode suffices to play this role. FIG. 6 also illustrates that it would have been beneficial also to decrease the controlled conduction time of the transistor, so as to approximate to a sinusoidal voltage even more closely. For a given frequency, this decrease must be accompanied by an increase in the natural period of the resonant circuit Lm, C, if one wishes to retain switching at the voltage zero.

The superposition of the current IC in the capacitor C and of the current IDS in the transistor gives the current in the transformer, a sinusoidal shape. In fact, the latter possesses a DC component, the product of which, with the supply voltage, gives the power transmitted, to within loss limits of the load. However, this value is small relative to the AC component and moreover, due to the gap, the transformer does not work in a saturation zone. The demagnetization coil of a "forward" structure is therefore completely unnecessary.

It is apparent that the resonance-type power supply uses only a small current in relation to the current crossing the components.

In the assembly used, the magnetizing current Io is more than eight times greater than the values encountered in a conventional transformer.

Although one might have expected that the circuit according to the invention would be penalized by the flow through the components of a resonant current greater, or even much greater, than the useful current, in fact quite the contrary occurs in the assemblies investigated. Since here the switching losses are almost zero, and the MOS components exhibit good conduction performance, it is unnecessary to resort to the sinks mounted on conventional half-bridge MOS assemblies intended for powering the same motors. The efficiency of the supply is excellent, this not being the least of its advantages.

Finally, it should be noted that the structure according to the invention using a transformer of low primary magnetizing inductance goes together well with a very strongly voltage-boosting assembly, as in the case of a standalone system connected to a few battery elements. Such a system requires a very high ratio for the number of turns, which realistically leads to a small number of turns at the primary, this tending to lead to low magnetizing inductance. In this case, the gap is unnecessary, or even prejudicial to a good assembly quality factor.

Multiple variations and modifications are possible in the embodiments of the invention described here. Although certain illustrative embodiments of the invention have been shown and described here, a wide range of modifications, changes, and substitutions is contemplated in the foregoing disclosure. In some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

What is claimed:

1. A power circuit for a resonant piezo-electric motor or actuator channel comprising a voltage source powering a circuit comprising an inductance in series with a capacitor (C) and a single switching element (T1) in parallel with the capacitor, and a means of control (O) of the switching element ensuring the cyclic closure thereof at a frequency close to the resonant frequency of the piezo-electric element, wherein the power circuit comprises a transformer (Tr) whose primary constitutes the inductance and whose secondary is linked to the piezo-electric exciter, this transformer exhibiting a small magnetic inductance at the primary, wherein the extra current absorbed at full load is always less than the no-load current, and wherein the sizing of this inductance and the choice of the capacitor are determined in such a way as to obtain switching in the vicinity of the voltage zero for the working frequency of the circuit.

2. A power circuit for a resonant piezo-electric motor or actuator channel comprising a voltage source powering a circuit comprising an inductance in series with a capacitor (C) and a single unidirectional switching element (T1) in parallel with the capacitor, and a means of control (O) of the switching element ensuring the cyclic closure thereof at a frequency close to the resonant frequency of the piezo-electric element, wherein the power circuit comprises a transformer (Tr) whose primary constitutes the inductance and whose secondary is linked to the piezo-electric exciter, this transformer exhibiting a small magnetic inductance at the primary, wherein the extra current absorbed at full load is always less than the no-load current, and wherein the sizing of this inductance and the choice of the capacitor are determined in such a way as to obtain switching in the vicinity of the voltage zero for the working frequency of the circuit, wherein it comprises a antiparallel diode (D) connected to the unidirectional switching element.

3. The power circuit as claimed in claim 1, wherein the transformer is furnished with a gap.

4. The power circuit as claimed in claim 2, wherein the transformer is furnished with a gap.

5. The power circuit as claimed in claim 2, in which the unidirectional switching element is a MOS transistor, wherein the antiparallel diode is constituted by the intrinsic PN junction between the source and the drain of the transistor.

6. The power circuit as claimed in claim 1, in which the unidirectional switching element is a MOS transistor, wherein the capacitor is constituted by the intrinsic capacitance of the MOS transistor.

* * * * *

UNITED STATES PATENT AND TRADEMARK OFFICE
CERTIFICATE OF CORRECTION

PATENT NO.   : 6,417,598 B2
DATED        : July 9, 2002
INVENTOR(S)  : Grehant

It is certified that error appears in the above-identified patent and that said Letters Patent is hereby corrected as shown below:

<u>Title page,</u>
Item [73], Assignee, replace "Metabole Development et Conseil" by -- Metabole Developpement et Conseil --

Signed and Sealed this

First Day of October, 2002

Attest:

Attesting Officer

JAMES E. ROGAN
*Director of the United States Patent and Trademark Office*